(12) United States Patent
Hautala

(10) Patent No.: US 8,481,340 B2
(45) Date of Patent: Jul. 9, 2013

(54) METHOD FOR PREPARING A LIGHT-EMITTING DEVICE USING GAS CLUSTER ION BEAM PROCESSING

(75) Inventor: John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 269 days.

(21) Appl. No.: 13/074,618

(22) Filed: Mar. 29, 2011

(65) Prior Publication Data

US 2011/0312106 A1    Dec. 22, 2011

Related U.S. Application Data

(60) Provisional application No. 61/355,477, filed on Jun. 16, 2010, provisional application No. 61/355,470, filed on Jun. 16, 2010.

(51) Int. Cl.
*H01L 21/00*    (2006.01)

(52) U.S. Cl.
USPC ................................ 438/7; 438/29; 438/46

(58) Field of Classification Search
USPC ....................... 438/7, 29, 38, 46–47
See application file for complete search history.

(56) References Cited

U.S. PATENT DOCUMENTS

| | | | |
|---|---|---|---|
| 4,361,762 A | 11/1982 | Douglas | |
| 4,886,971 A | 12/1989 | Matsumura et al. | |
| 4,916,311 A | 4/1990 | Fuzishita et al. | |
| 6,218,207 B1 | 4/2001 | Itoh et al. | |
| 6,416,820 B1 | 7/2002 | Yamada et al. | |
| 6,486,068 B2 * | 11/2002 | Yamasaki et al. | 438/706 |
| 6,797,339 B2 | 9/2004 | Akizuki et al. | |
| 7,060,989 B2 | 6/2006 | Swenson et al. | |
| 7,115,511 B2 * | 10/2006 | Hautala | 438/689 |
| 7,173,252 B2 | 2/2007 | Mack | |
| 2002/0130275 A1 | 9/2002 | Mack et al. | |
| 2003/0026990 A1 | 2/2003 | Yamada et al. | |
| 2006/0124934 A1 | 6/2006 | Fukumiya et al. | |
| 2007/0210366 A1 | 9/2007 | Sandhu et al. | |
| 2008/0149826 A1 | 6/2008 | Renau et al. | |
| 2008/0299749 A1 | 12/2008 | Jacobson et al. | |
| 2009/0071818 A1 | 3/2009 | Fukumiya et al. | |
| 2009/0087969 A1 | 4/2009 | Russell et al. | |
| 2009/0152629 A1 | 6/2009 | Hu et al. | |
| 2010/0227142 A1 | 9/2010 | Hautala et al. | |

FOREIGN PATENT DOCUMENTS

| | | |
|---|---|---|
| EP | 1918963 A2 | 5/2008 |
| JP | 62296357 A | 12/1987 |
| JP | 06275545 | 9/1994 |
| WO | 0026431 A1 | 5/2000 |

OTHER PUBLICATIONS

Nguyen, S. V., High-density Plasma Chemical Vapor Deposition of Silicon-based Dielectric Films for Integrated Circuits, J. Res. Develop., Jan./Mar. 1999, pp. 109-126, vol. 43, No. 1/2.

(Continued)

*Primary Examiner* — Richard Booth
(74) *Attorney, Agent, or Firm* — Wood, Herron & Evans, LLP

(57) ABSTRACT

A method of manufacturing semiconductor-based light-emitting devices, such as light-emitting diodes (LEDs), is described. The method comprises irradiating an interface region with a gas cluster ion beam (GCIB) to improve the interface region between a light-emitting device stack and the substrate, within the light-emitting device stack, and/or between the light-emitting device stack and a metal contact layer in an end-type contact.

31 Claims, 11 Drawing Sheets

OTHER PUBLICATIONS

Park et al., Evolution of Residual Stress in Plasma-enhanced Chemical-Vapor-Deposited Silicon Dioxide Film Exposed to Room Air, Applied Physics Letters, Dec. 13, 1999, pp. 3811-3813, vol. 75, No. 24.

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Witvrouw et al., A Comparison Between Wet HF Etching and Vapor HF Etching for Sacrificial Oxide Removal, SPIE vol. 4174 (2000), pp. 130-141.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

Hautala J., et al. "Infusion Processing: An Alternative to Plasma Technology for Semiconductor Device Manufacturing", Proceedings of the Electrochemical Society, Symposium on ULSI Process Integration IV (Quebec PR, Canada, May 16-20, 2005), vol. 6, pp. 118-130.

Shaq et al. "Nitrogen gas-cluster ion beam—A new nitrogen source for GaN growth", Mat. Res. Soc. Symp. Proc., 2003, vol. 743, pp. 97-102.

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

\* cited by examiner

METHOD FOR PREPARING A LIGHT-EMITTING DEVICE USING GAS CLUSTER ION BEAM PROCESSING

CROSS-REFERENCE TO RELATED APPLICATIONS

Pursuant to 37 CFR §1.78(a)(4), this application claims the benefit of and priority to U.S. Provisional Application Nos. 61/355,470 and 61/355,477, each filed on Jun. 16, 2010, the entire contents of which are herein incorporated by reference.

BACKGROUND OF THE INVENTION

1. Field of Invention

The invention relates to a method for fabricating a semiconductor-based light-emitting device, such as a light-emitting diode (LED).

2. Description of Related Art

Semiconductor-based light-emitting devices, such as LEDs, often radiate light in a more efficient manner than conventional incandescent light sources, as well as fluorescent light sources. The relatively high power efficiency combined with high brightness associated with LEDs has created substantial interest to displace conventional light sources in a variety of lighting applications.

Typically, a semiconductor-based light-emitting device is formed of multiple layers on a substrate, wherein the various materials and thicknesses thereof are selected to determine the wavelength(s) of light emitted by the device. The chemical composition of each layer is selected in an effort to isolate injected electrical charge carriers into regions (often referred to as quantum wells) for relatively efficient conversion to optical power. Generally, layers on a first side of the junction where a quantum well is formed are doped with donor atoms that result in high electron concentration (such layers are commonly referred to as n-type layers), and layers on a second side of the junction are doped with acceptor atoms that result in a relatively high hole concentration (such layers are commonly referred to as p-type layers).

Group III-nitride semiconductors, such as GaN for its wide direct bandgap, have demonstrated great promise in the formation of semiconductor-based light-emitting devices. In particular, GaN-based optical devices have found use in light emission within the green-blue region of the visible spectrum.

However, the practical, cost-wise implementation of Group III-nitride semiconductors has demonstrated many shortcomings and challenges, including, among other things, the integration of such materials with conventional substrate fabrication, i.e., silicon. Some of the integration challenges, to name a few, include differences in the coefficient of thermal expansion between light-emitting device stack layers and the substrate, adhesion of the light-emitting device stack layers to the substrate, and lattice mismatch between the light-emitting device stack layers and the substrate. Other challenges include, among other things, the preparation of a low resistance metal-semiconductor contact, i.e., contact between a metal layer and a Group III-nitride semiconductor layer. Metal-semiconductor contacts are known to exhibit poor resistance across their junction due to the Schottky barrier arising from the difference in work function of the metal and semiconductor layers.

As a result, in an effort to cure such issues, techniques are sought for integrating Group III-nitride semiconductors with various substrates, including silicon substrates, and with metal contacts.

SUMMARY OF THE INVENTION

The invention relates to a method for fabricating a semiconductor-based light-emitting device, such as a light-emitting diode (LED), and more particularly, a method for treating an interface region of a semiconductor-based light-emitting device stack using a gas cluster ion beam (GCIB). In one embodiment, the invention relates to a method for treating an end-type contact in a light-emitting device using a GCIB.

According to one embodiment, a method for preparing a semiconductor-based light-emitting device is described. The method comprises: forming a light-emitting device stack on a substrate; and irradiating at least a portion of an interface region between device layers within the light-emitting device stack, between the light-emitting device stack and a metal contact layer formed thereon, or between the light-emitting device stack and the substrate with a GCIB to amorphize the interface region, etch the interface region, clean the interface region, dope the interface region, infuse the interface region, modify the interface region, deposit material on the interface region, or grow material on the interface region, or any combination of two or more thereof.

According to another embodiment, the method further comprises preparing the interface region by forming an intermediate layer on the substrate between the substrate and the overlying light-emitting device stack, where the irradiating includes at least a portion of the substrate in the interface region to create a graded mixed layer at the interface region between the intermediate layer and the substrate.

According to a further or alternative embodiment, the method applies to preparing an end-type contact in a semiconductor-based light-emitting device. For a light-emitting device stack having a semiconductor layer; the method further comprises forming a metal contact layer on the semiconductor layer, and the irradiating includes the interface region between the semiconductor layer and the metal contact layer to modify a property of the metal contact layer, or the semiconductor layer, or both the metal contact layer and the semiconductor layer, and increase carrier tunneling between the metal contact layer and the semiconductor layer.

According to yet another embodiment, any of the above methods may further include performing corrective processing on the semiconductor-based light-emitting device. The method comprises acquiring metrology data for the substrate and/or the light-emitting device stack; computing correction data for location specific processing of the substrate and/or the light-emitting device stack; and applying the correction data to the substrate and/or the light-emitting device stack using a gas cluster ion beam GCIB.

DETAILED DESCRIPTION OF SEVERAL EMBODIMENTS

A method and system for fabricating a semiconductor-based light-emitting device, such as a light-emitting diode (LED), using a gas cluster ion beam (GCIB) is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Figure 1A:
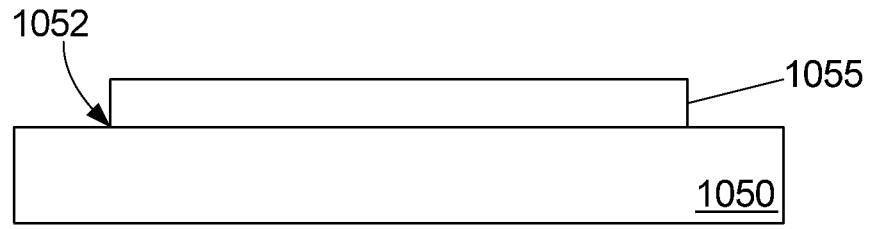
FIGS. 1A through 1C illustrate in schematic view a method for preparing a light-emitting device stack on a substrate according to an embodiment.
Figure 1B:
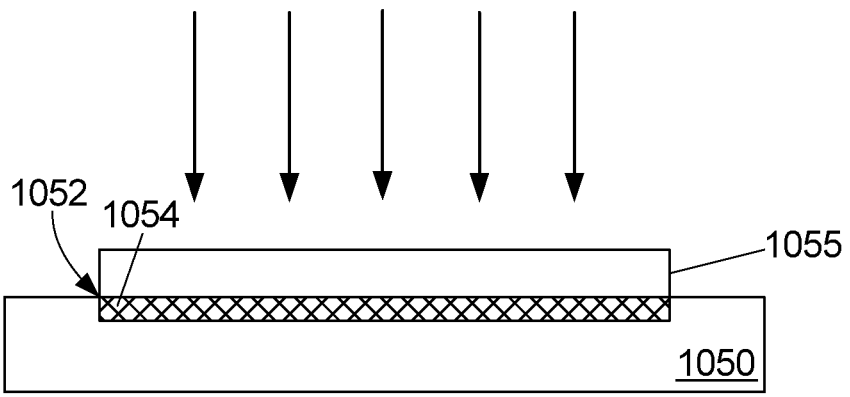
Figure 1C:
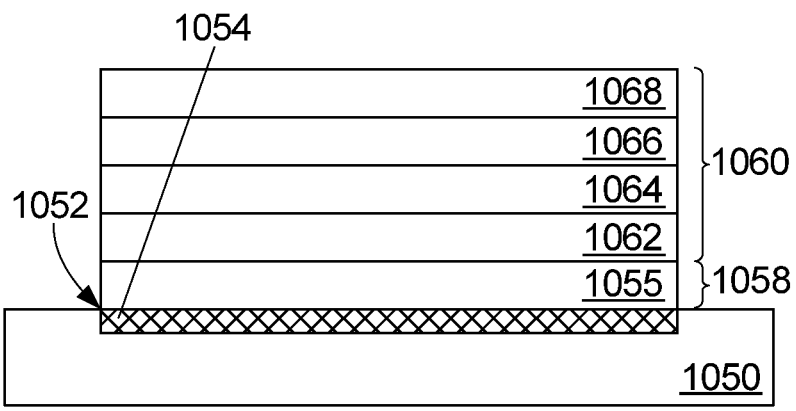
Figure 2:
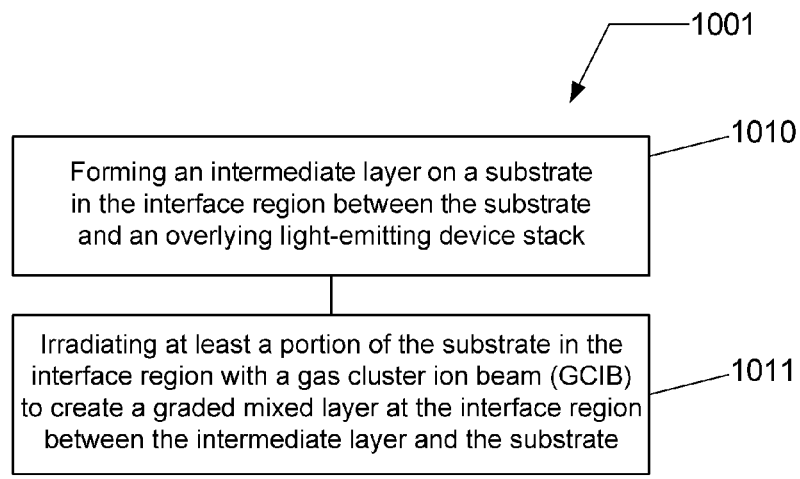
FIG. 2 is a flow chart illustrating a method for preparing an interface between a light-emitting device and a substrate according to another embodiment.

Referring now to the drawings wherein like reference numerals designate corresponding parts throughout the several views, a method of preparing a light-emitting device that includes a light-emitting device stack on a substrate is described in FIGS. 1A through 1C according to an embodiment. Furthermore, FIG. 2 provides a flow chart 1 illustrating a method for preparing an interface between a semiconductor-based light-emitting device and a substrate according to, for example, the embodiment of FIGS. 1A-1C. The formation of the light-emitting device stack may include the formation of a LED.

In step 1010 and as shown in FIG. 1A, when preparing the light-emitting device, an intermediate layer 1055 is formed on a substrate 1050. The substrate 1050 may comprise a silicon-containing substrate, such as doped silicon, un-doped silicon, single crystal silicon, poly-crystalline silicon, silicon-germanium (SiGe), or silicon carbide (SiC), or any combination of two or more thereof. Alternatively, the substrate 1050 may comprise a compound semiconductor, a metal, a metal alloy, zinc oxide, CuW, or sapphire, or any combination of two or more thereof.

As shown in FIG. 1C, the intermediate layer 1055 is configured to be disposed in an interface region 1058 between the substrate 1050 and an overlying light-emitting device stack 1060 having a plurality of device layers (1062, 1064, 1066, 1068). The intermediate layer 1055 may have the same composition as the first deposited layer 1062 in the light-emitting device stack 1060, such that it is configured to serve as a transition layer to the base layer of the light-emitting device layer stack 1060. Additionally or alternatively, the intermediate layer 1055 may include a buffer layer between the light-emitting device stack 1060 and the substrate 1050, an adhesion-promoting layer between the light-emitting device stack 1060 and the substrate 1050, a transition layer having an intermediate value for a coefficient of thermal expansion, or a transition layer for improving lattice mismatch between substrate 1050 and an overlying layer, or any combination of two or more thereof.

Additionally, for example, the intermediate layer 1055 may include a nitride-containing layer. Additionally yet, for example, the intermediate layer 1055 may include a Group III-nitride layer, a GaN layer, an AlN layer, or an AlGaN layer, or any combination of two or more thereof. Herein, a Group III-nitride layer includes nitride compounds of Group III elements, or Group 13 elements (per the new IUPAC convention).

The intermediate layer 1055 may be deposited using a vapor deposition process, such as a physical vapor deposition (PVD) process or variations thereof, a chemical vapor deposition (CVD) process or variations thereof, an epitaxial vapor deposition process or variations thereof, a non-epitaxial vapor deposition process or variations thereof, an electron beam evaporation deposition process or variations thereof, or an atomic layer deposition (ALD) process or variations thereof. Alternatively, the intermediate layer 1055 may be grown or deposited using a gas cluster ion beam (GCIB). Prior to forming the intermediate layer 1055, the substrate 1050 may be cleaned using a dry and/or wet cleaning process to, for example, remove native oxide. Optionally, another intermediate layer may be formed over the intermediate layer 1055.

In 1011 and as shown in FIG. 1B, at least a portion of substrate 1050 in the interface region 1058 is irradiated by a gas cluster ion beam (GCIB) in order to, among other things, create a graded mixed layer 1054 at an interface 1052 in the interface region 1058 between the intermediate layer 1055 and the substrate 1050. The irradiation of at least a portion of substrate 1050 may follow the formation of the intermediate layer 1055. When GCIB treatment follows formation of the intermediate layer 1055, the GCIB treatment may be utilized to modify, amorphize, and/or dope the exposed portion of substrate 1050 to form the graded mixed layer 1054 having a pre-determined thickness. For example, the GCIB treatment may drive species of intermediate layer 1055 into substrate 1050. In one embodiment, the intermediate layer 1055 is identical in composition to device layer 1062, which will be subsequently deposited and which is further described below, e.g., it may be a semiconductor layer, either p- or n-doped. The GCIB treatment may then use species from the intermediate layer to create a transition between the substrate 1050 and the first deposited semiconductor layer 1062 of the stack 1060. Essentially, the intermediate layer 1055 and device layer 1062 then form the base of the light-emitting device with a good transition from the substrate by virtue of the GCIB processing of the intermediate layer 1055.

Alternatively, the irradiation of at least a portion of substrate 1050 may precede the formation of the intermediate layer 1055. When GCIB treatment precedes formation of the intermediate layer 1055, the GCIB treatment may be utilized to modify, amorphize, and/or dope the exposed portion of substrate 1050 to form the graded mixed layer 1054 having a pre-determined thickness. The subsequently deposited intermediate layer 1055 may then include a buffer layer, an adhesion-promoting layer, or other type of transition layer.

The GCIB may be generated from a pressurized gas mixture that includes a noble gas (i.e., He, Ne, Ar, Kr, Xe). Additionally, the GCIB may be generated from a pressurized gas mixture that includes at least one element selected from the group consisting of He, Ne, Ar, Xe, Kr, B, C, Si, Ge, N, P, As, O, S, F, Cl, and Br. Furthermore, the GCIB may be generated from a pressurized gas mixture that includes at least one film forming constituent for depositing or growing a thin film on the substrate 1050 or the intermediate layer 1055.

The GCIB may be used to form a graded mixed layer having a pre-determined thickness in the substrate. Additionally, the GCIB may be used to form a graded mixed layer having a pre-determined interfacial roughness at an upper and/or a lower boundary of the graded mixed layer. The graded mixed layer may be amorphous and may promote greater penetration of the base of intermediate layer 1055 into substrate 1050. Additionally, the graded mixed layer may include one or more dopants and/or impurities infused using the GCIB. Furthermore, the graded mixed layer may include a concentration profile extending partly or fully through the mixed layer that is tailored via adjustment of one or more GCIB processing parameters of the GCIB.

In addition to irradiation of the substrate with the GCIB, another GCIB may be used for additional control and/or function. Irradiation of the substrate by another GCIB may proceed before, during, or after use of the GCIB. For example, another GCIB may be used to dope the portion of the substrate with an impurity. The doping may comprise introducing one or more elements selected from the group consisting of He, Ne, Ar, Xe, Kr, B, C, Si, Ge, N, P, As, O, S, F, Cl, and Br.

The portion of the substrate subjected to GCIB irradiation may be cleaned before or after the irradiating with the GCIB. For example, the cleaning process may include a dry cleaning process and/or a wet cleaning process. Additionally, the portion of the substrate subjected to GCIB irradiation may be annealed after the irradiating with the GCIB.

Following GCIB treatment, one or more additional intermediate layers may be formed on intermediate layer 1055. The additional intermediate layer may have the same composition as intermediate layer 1055. Alternatively, the additional intermediate layer may have a different composition as intermediate layer 1055. Additional intermediate layers may also be treated with a GCIB, if desired, to provide smooth transition in properties from the substrate to the device stack 1060.

As shown in FIG. 1C, the light-emitting device stack 1060 is formed on substrate 1050. The light-emitting device stack 1060 comprises multiple layers, such as device layers 1062, 1064, 1066, and 1068. Although the light-emitting device stack 1060 is depicted with four layers, the device stack may possess a lesser number of layers or a greater number of layers. The first deposited device layer 1062 may include a first semiconductor layer, such as an n-doped semiconductor layer. For example, the n-doped semiconductor layer may include n-doped GaN or n-doped Si:GaN. The second deposited device layer 1064 may include a current spreading layer, such as an AlGaN/GaN hetero-junction or super-lattice. The third deposited device layer 1066 may include a light-emitting layer such as an InGaN/GaN multi-quantum well. The fourth or last deposited device layer 1068 may include a second semiconductor layer, such as a p-doped semiconductor layer. For example, the p-doped semiconductor layer may include p-doped GaN or p-doped Mg:GaN. Alternatively, the order of the device layers (1062, 1064, 1066, 1068) may be reversed. Generally, a vertical light-emitting device stack 1060 minimally includes top and bottom semiconductor layers 1062 and 1068, one of which is p-doped and one of which is n-doped, with a quantum well therebetween, but may be configured differently and/or with additional layers. A device stack may also be laterally-oriented, although not depicted.

Any one of the light-emitting device stack layers (1062, 1064, 1066, 1068) may be deposited using a vapor deposition process, such as a PVD process or variations thereof, a CVD process or variations thereof, an epitaxial vapor deposition process or variations thereof, a non-epitaxial vapor deposition process or variations thereof, an electron beam evaporation deposition process or variations thereof, or an ALD process or variations thereof.

According to one embodiment, at least one portion of substrate 1050 is exposed to one or more other GCIB treatments before, during, or after any one of the process steps described in FIGS. 1A through 1C. Furthermore, a cleaning step and/or an annealing step may be inserted before or after any one of the process steps described above.

Figure 3A:
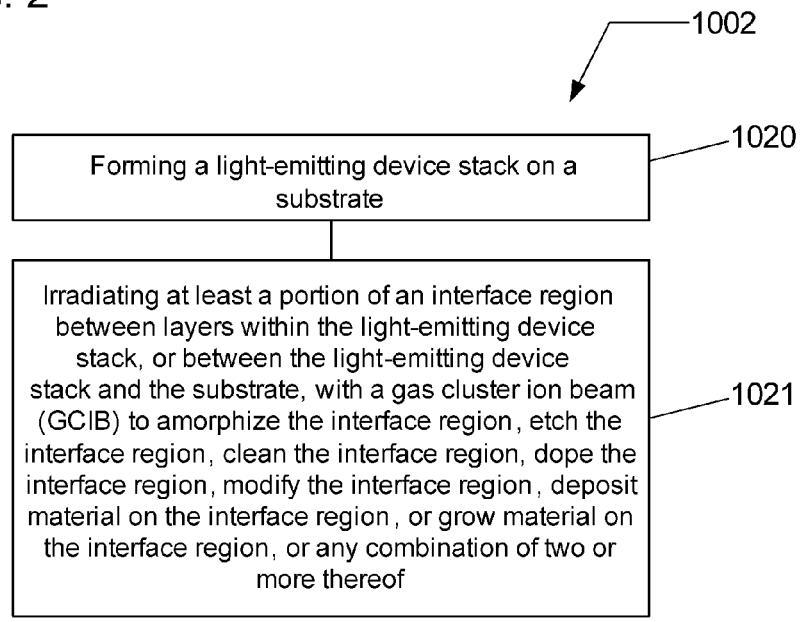
FIG. 3A is a flow chart illustrating a method for preparing a light-emitting device according to another embodiment.
Figure 3B:
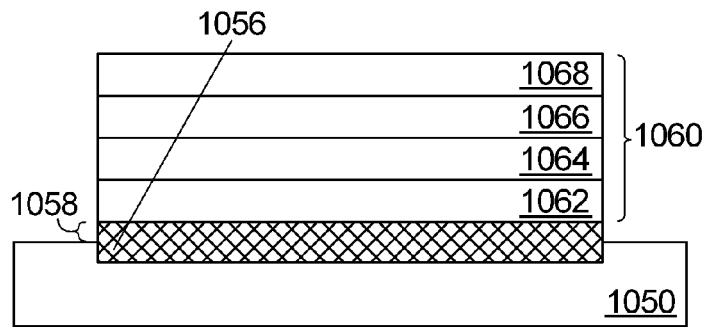
FIG. 3B is a schematic view illustrating a method for preparing a light-emitting device stack on a substrate according to another embodiment.

Referring now to FIGS. 3A and 3B, a method for preparing a semiconductor-based light-emitting device is described according to another embodiment. The method is illustrated by a flow chart 1002 in FIG. 3A and a schematic view of a device in FIG. 3B. Beginning in 1020 and with reference to FIG. 3B, the method includes forming a light-emitting device stack 1060 on a substrate 1050. In 1021, at least a portion of an interface region 1058 between the light-emitting device stack 1058 and the substrate 1050 is irradiated with a GCIB to amorphize the interface region 1058, etch the interface region 1058, clean the interface region 1058, dope the interface region 1058, modify the interface region 1058, deposit material on the interface region 1058, or grow material on the interface region 1058, or any combination of two or more thereof. As depicted in FIG. 3B, a transition layer 1056 is formed in the interface region 1058, for example by doping, growing and/or depositing material in the interface region 1058. In this example, the irradiating precedes the formation of the light-emitting device stack 1060 on the substrate 1050.

Figure 4:
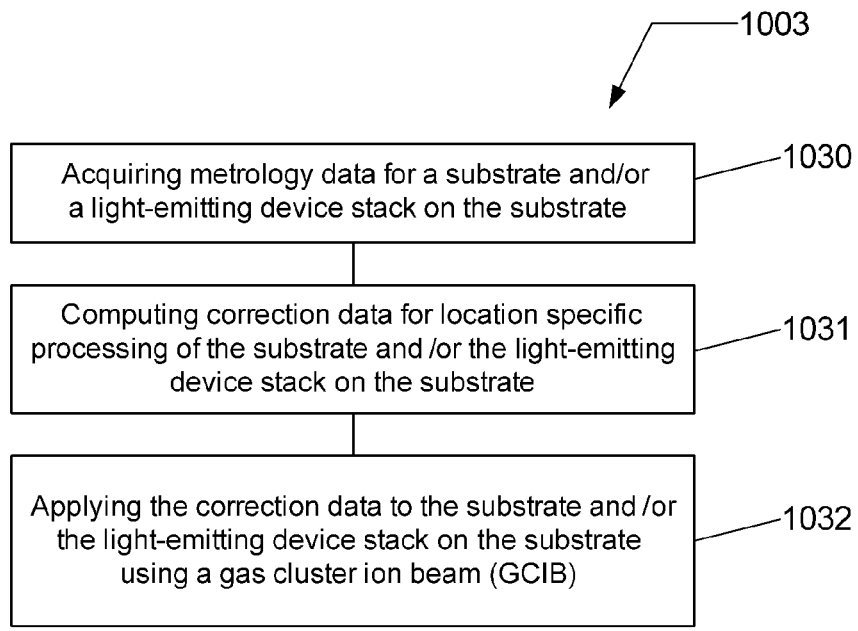
FIG. 4 is a flow chart illustrating a method for performing corrective processing on a light-emitting device according to another embodiment.

Referring now to FIG. 4, a method for performing corrective processing on a semiconductor-based light-emitting device is described according to yet another embodiment. The method comprises a flow chart 1003 beginning in 1030 with acquiring metrology data for a substrate (e.g., substrate 1050) and/or a light-emitting device stack (e.g., device stack 1060) on the substrate.

Metrology data may be acquired using a metrology system coupled to a GCIB processing system, either in-situ or ex-situ. The metrology system may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, the metrology system may comprise an optical digital profilometer (ODP), a scatterometer, an ellipsometer, a reflectometer, an interferometer, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

The metrology data can include parametric data, such as geometrical, mechanical, electrical and/or optical parameters associated with the substrate, any layer formed on the substrate, and/or any portion of the light-emitting device. For example, metrology data can include any parameter measurable by the metrology systems described above. Additionally, for example, metrology data can include a film thickness, a surface/interface roughness, a surface contamination, a feature depth, a trench depth, a via depth, a feature width, a trench width, a via width, a critical dimension (CD), an electrical resistance, or any combination of two or more thereof.

The metrology data is measured at two or more locations on the substrate. Moreover, this data may be acquired and collected for one or more substrates. The one or more substrates may, for instance, include a cassette of substrates. The metrology data is measured at two or more locations on at least one of the one or more substrates and may, for example, be acquired at a plurality of locations on each of the one or more substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the one or more substrates using the metrology system, the metrology data is provided to a controller for computing correction data. Metrology data can be communicated between the metrology system and the controller via a physical connection (e.g., a cable), or a wireless connection, or a combination thereof. Additionally, the metrology data can be communicated via an intranet or Internet connection. Alternatively, metrology data may be communicated between the metrology system and the controller via a computer readable medium.

In 1031, correction data is computed for location specific processing of the substrate and/or the light-emitting device stack on the substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the controller determines correction data for each substrate. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

In 1032, the correction data is applied to the substrate and/or the light-emitting device stack on the substrate using a GCIB. During corrective processing, the GCIB may be configured to perform at least one of smoothing, amorphizing, modifying, doping, etching, growing, or depositing, or any combination of two or more thereof. The application of the corrective data to the substrate may facilitate correction of substrate defects, correction of light-emitting device stack layer defects, correction of substrate surface planarity, correction of layer thickness, or improvement of layer adhesion. Once processed to GCIB specifications, the uniformity of the substrate(s) or distribution of the parametric data for the substrate(s) may be examined either in-situ or ex-situ, and the process may be finished or refined as appropriate.

Figure 5:
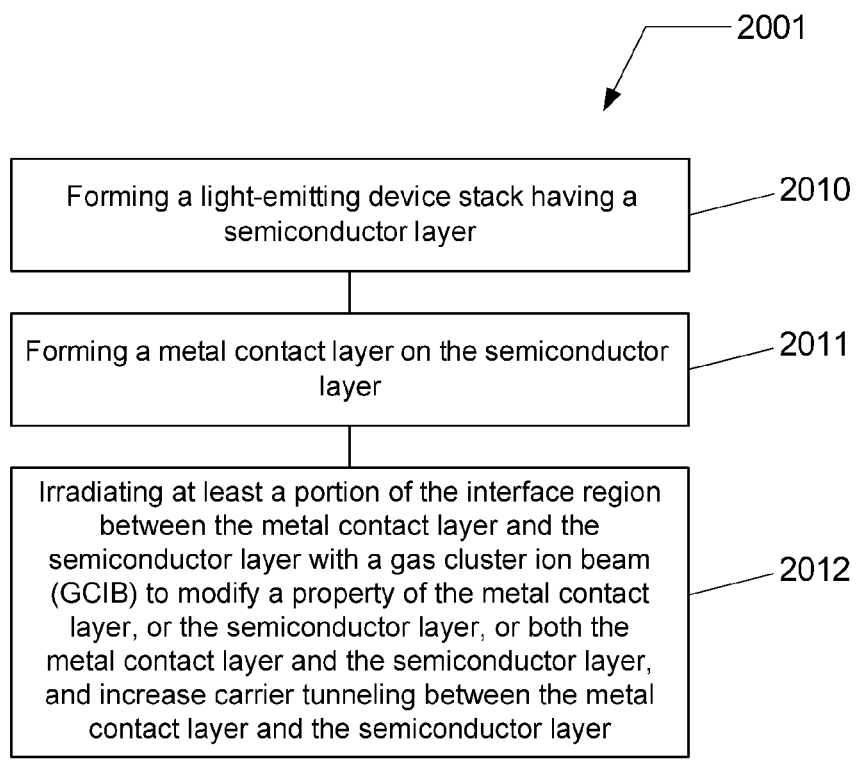
FIG. 5 is a flow chart illustrating a method of preparing an end-type contact for a light-emitting device according to another embodiment.

Referring now to FIG. 5, a method of preparing an end-type contact for a light-emitting device is provided according to another embodiment. The method includes flow chart 2001 beginning in 2010 with forming a light-emitting device stack having a semiconductor layer. The formation of the light-emitting device stack may include the formation of a LED.

The light-emitting device may include a vertical-type device, wherein the light-emitting device is formed on a conductive (e.g., highly doped semiconductor substrate) that requires a contact on a top surface of the light-emitting device and another contact on the substrate. Alternatively, the light-emitting device may include a lateral-type device, wherein multiple contacts are located on the top surface of the device. A vertical-type device is described below.

Figure 6A:
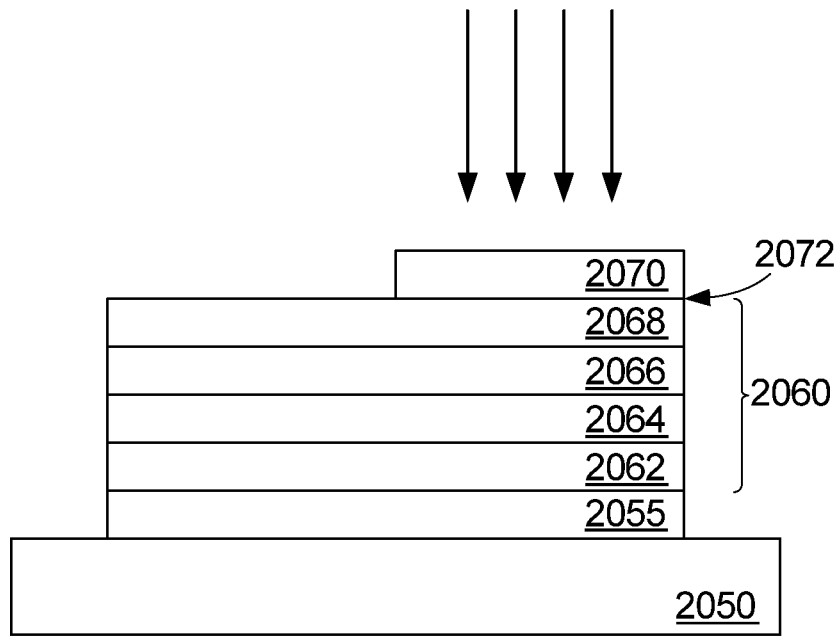
FIGS. 6A and 6B illustrate in schematic view a method for preparing an end-type contact for a light-emitting device on a substrate according to an embodiment.
Figure 7A:
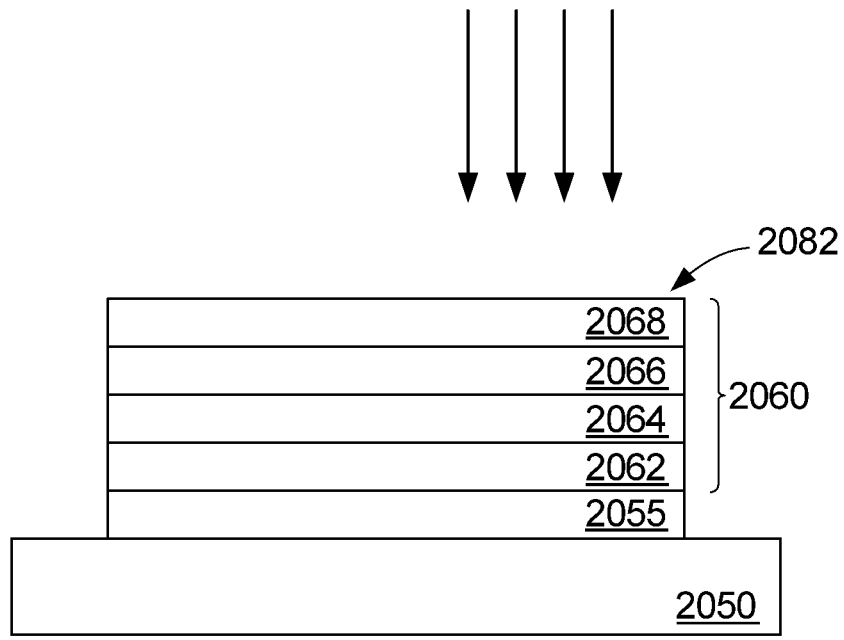
FIGS. 7A and 7B illustrate in schematic view a method for preparing an end-type contact for a light-emitting device on a substrate according to another embodiment.
Figure 8A:
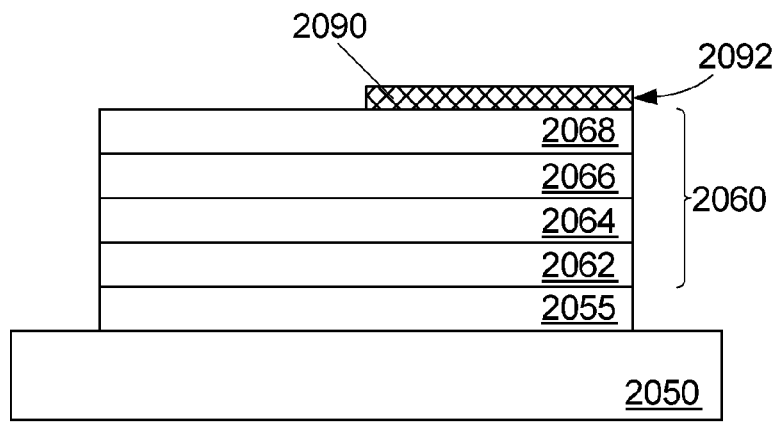
FIGS. 8A through 8C illustrate in schematic view a method for preparing an end-type contact for a light-emitting device on a substrate according to yet another embodiment.

As illustrated in FIGS. 6A, 7A, and 8A, when preparing the light-emitting device in 2010, a light-emitting device stack 2060 having device layers (e.g., 2062, 2064, 2066, 2068) and an intermediate layer 2055 are formed on a substrate 2050, wherein the light-emitting device stack 2060 includes at least one semiconductor layer. For example, the semiconductor layer may include the fourth device layer 2068. The substrate 2050 may be the same or different as described above for substrate 1050.

The intermediate layer 2055 is optional. The intermediate layer 2055 may be disposed between the substrate 2050 and the overlying light-emitting device stack 2060. If intermediate layer 2055 is of the same composition as the first deposited device layer 2062, then it is essentially configured to serve as a base layer of the light-emitting device stack 2060 together with device layer 2062. For example, the intermediate layer 2055 may include an identical layer in composition to first deposited device layer 2062 of light-emitting device stack 2060, a buffer layer between the light-emitting device stack 2060 and the substrate 2050, an adhesion-promoting layer between the light-emitting device stack 2060 and the substrate 2050, a transition layer having an intermediate value for a coefficient of thermal expansion, or a transition layer for improving lattice mismatch between substrate 2050 and an overlying layer, or any combination of two or more thereof.

Additionally, for example, the intermediate layer 2055 may include a nitride-containing layer. Additionally yet, for example, the intermediate layer 2055 may include a Group III-nitride layer (as defined above), GaN layer, an AlN layer, or an AlGaN layer, or any combination of two or more thereof. The disclosure above relating to intermediate layer 1055 is equally applicable to intermediate layer 2055 as if set forth here again.

As illustrated in FIGS. 6A, 7A, and 8A, the light-emitting device stack 2060 comprises multiple layers, such as device layers 2062, 2064, 2066, 2068, which are the same or similar to device layers 1062, 1064, 1066, and 1068 described above, and the above discussion applies equally to device stack 2060 as if set forth here again.

In 2011, a metal contact layer 2070 is formed on the semiconductor layer, e.g., the fourth device layer 2068. An interface region 2072 is then created therebetween. The metal contact layer 2070 may include Au, Al, Ni, Pt, Pd, In, or an alloy thereof. The metal contact layer 2070 may be deposited using a vapor deposition process, such as a PVD process or variations thereof, a CVD process or variations thereof, an epitaxial vapor deposition process or variations thereof, a non-epitaxial vapor deposition process or variations thereof, an electron beam evaporation deposition process or variations thereof, or an ALD process or variations thereof.

In 2012, at least a portion of the interface region 2072 is irradiated with a GCIB to modify a property of the metal contact layer 2070, or the semiconductor layer (2068), or both the metal contact layer 2070 and the semiconductor layer (2068), and increase carrier tunneling between the metal contact layer 2070 and the semiconductor layer (2068). The irradiation with the GCIB may be performed before or after the metal contact layer 2070 is formed.

Figure 6B:
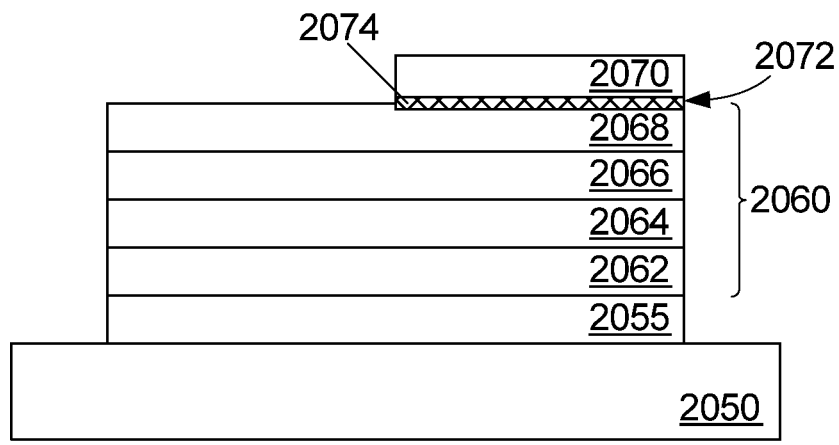

According to one embodiment, as shown in FIGS. 6A and 6B, interface region 2072 is irradiated with the GCIB following the formation of the metal contact layer 2070, as shown in FIG. 6A. When GCIB treatment follows formation of the metal contact layer 2070, the GCIB treatment may be utilized to modify, amorphize, and/or dope the interface region 2072 to alter properties of the metal contact layer 2070. For example, the GCIB treatment may be used to alter the work function of metal contact layer 2070. Additionally, for example, the GCIB treatment may be used to modify the metal contact layer 2070 to support increased carrier tunneling through the interface region 2072 between the metal contact layer 2070 and the semiconductor layer, e.g., the fourth device layer 2068. Additionally yet, for example, the GCIB treatment may be used to create a mixed layer of metal and semiconductor material in the interface region 2072 between the metal contact layer 2070 and the semiconductor layer (2068).

The GCIB may be generated from a pressurized gas mixture that includes a noble gas (i.e., He, Ne, Ar, Kr, Xe). Additionally, the GCIB may be generated from a pressurized gas mixture that includes at least one element selected from the group consisting of He, Ne, Ar, Xe, Kr, B, C, Si, Ge, N, P, As, O, S, F, Cl, and Br. Furthermore, the GCIB may be generated from a pressurized gas mixture that includes at least one film forming constituent for depositing or growing a thin film on the metal contact layer 2070.

As shown in FIG. 6B, the GCIB may be used to form a graded mixed layer 2074 in the interface region 2072 between the metal contact layer 2070 and the semiconductor layer, wherein the graded mixed layer 2074 has a pre-determined thickness. The graded mixed layer 2074 may promote greater carrier tunneling through the interface region 2072 between the metal contact layer 2070 and the semiconductor layer, e.g., the fourth device layer 2068. Additionally, the graded mixed layer 2074 may include one or more dopants and/or impurities infused using the GCIB. Furthermore, the graded mixed layer 2074 may include a concentration profile extending partly or fully through the mixed layer that is tailored via adjustment of one or more GCIB processing parameters of the GCIB.

In addition to irradiation of the interface region 2072 with the GCIB, another GCIB may be used for additional control and/or function. Irradiation of the interface region 2072 by another GCIB may proceed before, during, or after use of the GCIB. For example, another GCIB may be used to dope the interface region 2072 with an impurity. The doping may comprise introducing one or more elements selected from the group consisting of He, Ne, Ar, Xe, Kr, B, C, Si, Ge, N, P, As, O, S, F, Cl, and Br.

The interface region 2072 subjected to GCIB irradiation may be cleaned before or after the irradiating with the GCIB. For example, the cleaning process may include a dry cleaning process and/or a wet cleaning process. Additionally, the interface region 2072 subjected to GCIB irradiation may be annealed after the irradiating with the GCIB.

Following GCIB treatment, an additional metal contact layer may be formed on metal contact layer 2070. The additional metal contact layer may be formed using conventional deposition/growth techniques, or via use of a GCIB. The additional metal contact layer may have the same composition as metal contact layer 2070. Alternatively, the additional metal contact layer may have a different composition as metal contact layer 2070.

Figure 7B:
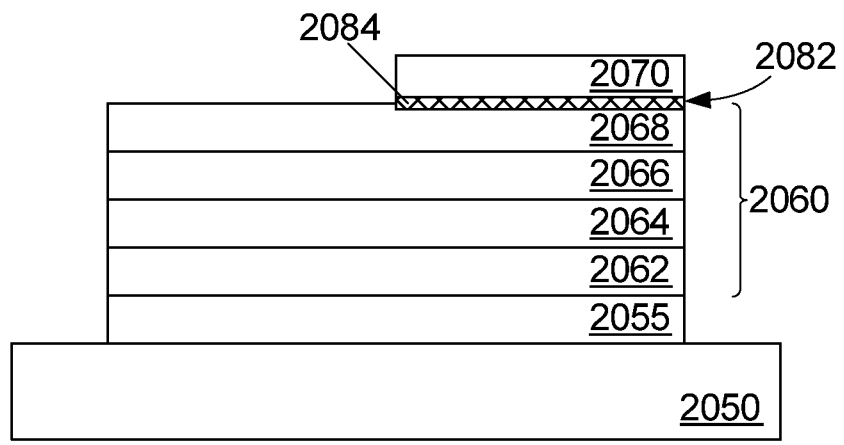

According to another embodiment, as shown in FIGS. 7A and 7B, interface region 2072 is irradiated with the GCIB (see FIG. 7A) preceding the formation of the metal contact layer 2070 (see FIG. 7B). When GCIB treatment precedes formation of the metal contact layer 2070, the GCIB treatment may be utilized to modify, amorphize, and/or dope the exposed portion of light-emitting device stack 2060 to alter properties of the semiconductor layer, e.g., the fourth device layer 2068. For example, the GCIB treatment may be used to alter the work function of the semiconductor layer (2068). Additionally, for example, the GCIB treatment may be used to modify the semiconductor layer (2068) to support increased carrier tunneling through interface region 2082 between the metal contact layer 2070 and the semiconductor layer (2068). Additionally yet, for example, the GCIB treatment may be used to dope the semiconductor material at the interface region 2082 between the metal contact layer 2070 and the semiconductor layer (2068) in order to manipulate depletion levels in the semiconductor layer (2068).

The GCIB may be generated from a pressurized gas mixture that includes a noble gas (i.e., He, Ne, Ar, Kr, Xe). Additionally, the GCIB may be generated from a pressurized gas mixture that includes at least one element selected from the group consisting of He, Ne, Ar, Xe, Kr, B, C, Si, Ge, N, P, As, O, S, F, Cl, and Br. Furthermore, the GCIB may be generated from a pressurized gas mixture that includes at least one film forming constituent for depositing or growing a thin film on the semiconductor layer (2068).

The GCIB may be used to form a graded mixed layer 2084 at interface region 2082 between the metal contact layer 2070 and the semiconductor layer (2068), wherein the graded mixed layer 2084 has a pre-determined thickness. The graded mixed layer 2084 may promote greater carrier tunneling through the interface region 2082 between the metal contact layer 2070 and the semiconductor layer, e.g., the fourth device layer 2068. Additionally, the graded mixed layer 2084 may include one or more dopants and/or impurities infused using the GCIB. Furthermore, the graded mixed layer 2084 may include a concentration profile extending partly or fully through the mixed layer that is tailored via adjustment of one or more GCIB processing parameters of the GCIB.

In addition to irradiation of the interface region 2082 with the GCIB, another GCIB may be used for additional control and/or function. Irradiation of the interface region 2082 by another GCIB may proceed before, during, or after use of the GCIB. For example, another GCIB may be used to dope the interface region 2082 with an impurity. The doping may comprise introducing one or more elements selected from the group consisting of He, Ne, Ar, Xe, Kr, B, C, Si, Ge, N, P, As, O, S, F, Cl, and Br.

The interface region 2082 subjected to GCIB irradiation may be cleaned before or after the irradiating with the GCIB. For example, the cleaning process may include a dry cleaning process and/or a wet cleaning process. Additionally, the interface region 2082 subjected to GCIB irradiation may be annealed after the irradiating with the GCIB.

Following GCIB treatment and prior to formation of the metal contact layer 2070, a conductive layer, a non-conductive layer, or an additional semiconductor layer may be formed on the semiconductor layer. This additional layer may be formed using conventional deposition/growth techniques, or via use of a GCIB. Further, this additional layer may have the same composition as the semiconductor layer. Alternatively, this additional layer may have a different composition as the semiconductor layer.

Figure 8B:
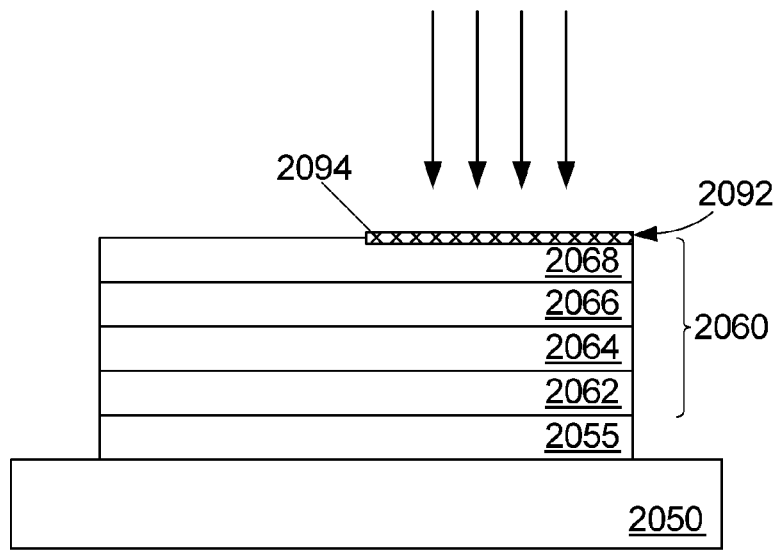
Figure 8C:
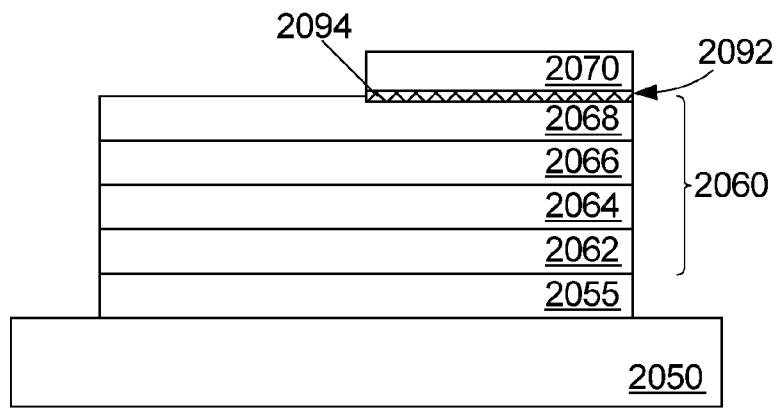

According to yet another embodiment, as shown in FIGS. 8A through 8C, one or more material layers 2090 are formed on the semiconductor layer (or between the metal contact layer 2070 and the semiconductor layer) in the interface region 2092 and then subjected to GCIB irradiation. The GCIB treatment may precede or follow the formation of the metal contact layer 2070. As shown in FIG. 8A, the one or more material layers 2090 are formed on the fourth device layer 2068 and, as shown in FIG. 8B, the one or more material layers 2090 are irradiated with the GCIB to form an altered layer 2094 in the interface region 2092. Thereafter, as shown in FIG. 8C, the metal contact layer 2070 is formed at the interface region 2092.

The GCIB treatment may be utilized to modify, amorphize, and/or dope the one or more material layers 2090 and/or the semiconductor layer, e.g., the fourth device layer 2068 to alter properties thereof. For example, the GCIB treatment may be used to alter the work function of the semiconductor layer (2068). Additionally, for example, the GCIB treatment may be used to modify the semiconductor layer (2068) to support increased carrier tunneling through the interface region 2092 between the metal contact layer 2070 and the semiconductor layer (2068). Additionally yet, for example, the GCIB treatment may be used to dope the semiconductor material at the interface region 2092 between the metal contact layer 2070 and the semiconductor layer (2068) in order to manipulate depletion levels in the semiconductor layer (2068).

The one or more material layers 2090 may include a Group II-VI compound. Furthermore, the one or more material layers 2090 may include a dopant, such as Mg, Be, or As, or a combination thereof. Herein, a Group II-VI compound includes a compound of a Group II element and a Group VI element, or a Group 12 element and a Group 16 element (per the new IUPAC convention).

The GCIB may be generated from a pressurized gas mixture that includes a noble gas (i.e., He, Ne, Ar, Kr, Xe). Additionally, the GCIB may be generated from a pressurized gas mixture that includes at least one element selected from the group consisting of He, Ne, Ar, Xe, Kr, B, C, Si, Ge, N, P, As, O, S, F, Cl, and Br. Furthermore, the GCIB may be generated from a pressurized gas mixture that includes at least one film forming constituent for depositing or growing a thin film on the semiconductor layer (2068).

The GCIB may be used to form a graded mixed layer 2094 at interface region 2092 between the metal contact layer 2070 and the semiconductor layer, wherein the graded mixed layer 2094 has a pre-determined thickness. The graded mixed layer 2094 may promote greater carrier tunneling through the interface region 2092 between the metal contact layer 2070 and the semiconductor layer, e.g., the fourth device layer 2068. Additionally, the graded mixed layer 2094 may include one or more dopants and/or impurities infused using the GCIB. Additionally yet, the graded mixed layer 2094 may include one or more materials, dopants and/or impurities driven into the semiconductor layer (2068) from the one or more material layers 2090 using the GCIB. Furthermore, the graded mixed layer 2094 may include a concentration profile extending partly or fully through the mixed layer that is tailored via adjustment of one or more GCIB processing parameters of the GCIB.

In addition to irradiation of the interface region 2092 with the GCIB, another GCIB may be used for additional control and/or function. Irradiation of the interface region 2092 by another GCIB may proceed before, during, or after use of the GCIB. For example, another GCIB may be used to dope the interface region 2092 with an impurity. The doping may comprise introducing one or more elements selected from the group consisting of He, Ne, Ar, Xe, Kr, B, C, Si, Ge, N, P, As, O, S, F, Cl, and Br. For example, the semiconductor layer (2068) may be irradiated by another GCIB containing N to restore the nitrogen content of the semiconductor layer (2068).

The interface region 2092 subjected to GCIB irradiation may be cleaned before or after the irradiating with the GCIB. For example, the cleaning process may include a dry cleaning process and/or a wet cleaning process. Additionally, the interface region 2092 subjected to GCIB irradiation may be annealed after the irradiating with the GCIB.

Following GCIB treatment and prior to formation of metal contact layer 2070, a conductive layer, a non-conductive layer, an additional semiconductor layer, or an additional material layer may be formed on the one or more material layers 2090 and/or the semiconductor layer (2068). This additional layer may be formed using conventional deposition/ growth techniques, or via use of a GCIB. Further, this additional layer may have the same composition as semiconductor layer (2068). Alternatively, this additional layer may have a different composition as the semiconductor layer (2068).

Any combination of process steps described with reference to FIGS. 6A-6B, 7A-7B, and 8A-8C is contemplated.

As described above, one or more GCIB treatments may be performed to modify and/or enhance a material property of a substrate, intermediate layer, device stack layer, or metal contact layer during the preparation of a light-emitting device on a substrate. For any one of these GCIB treatments, a GCIB operation may comprise: establishing a GCIB; selecting a beam energy, a beam energy distribution, a beam focus, and a beam dose; accelerating the GCIB to achieve the beam energy; focusing the GCIB to achieve the beam focus; and exposing the interface region to the accelerated GCIB according to the beam dose. The GCIB treatment may further comprise selecting the beam energy and the beam dose to achieve a desired thickness of a mixed layer formed during irradiation of the interface region with the GCIB.

A GCIB may be established having an energy per atom ratio ranging from about 0.25 eV per atom to about 100 eV per atom. Alternatively, the GCIB may be established having an energy per atom ratio ranging from about 0.25 eV per atom to about 10 eV per atom. Alternatively, the GCIB may be established having an energy per atom ratio ranging from about 1 eV per atom to about 10 eV per atom. The GCIB can be formed in a GCIB processing system, such as any of the GCIB processing systems (100, 100' or 100") described below in FIG. 9, 10 or 11, or any combination thereof.

The substrate to be treated may be provided in a reduced-pressure environment in a GCIB processing system. The substrate may be positioned on a substrate holder and may be securely held by the substrate holder. The temperature of the substrate may or may not be controlled. For example, the substrate may be heated or cooled during a film forming process. The environment surrounding the substrate is maintained at a reduced pressure.

A GCIB may be generated in the reduced-pressure environment, and can be generated from a pressurized gas mixture. The pressurized gas mixture may use a material source comprising one or more gases containing elements selected from the group consisting of He, Ne, Ar, Kr, Xe, B, C, Si, Ge, N, P, As, O, S, F, and Cl. For example, the material source may comprise He, Ne, Ar, Kr, Xe, $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, $BF_3$, $B_2H_6$, $AsH_3$, $AsF_5$, $PH_3$, $PF_3$, $PCl_5$, or $PF_5$, or any combination of two or more thereof.

A beam acceleration potential, a beam dose, a stagnation pressure, a stagnation temperature, a mass flow rate, a cluster size, a beam size, a beam composition, and/or beam electrode potential can be selected. The beam acceleration potential, the beam dose, the cluster size, and/or any one or more of the aforementioned GCIB properties can be selected to achieve pre-specified properties for the target region. For example, the beam acceleration potential, cluster size, and/or beam dose may be adjusted to alter the material properties of the target region, i.e., as will be described below, alter a concentration of one or more species within the target region, a concentration profile of one or more species within the target region, or depth of one or more species within the target region, or any combination thereof. The beam acceleration potential may range up to 100 kV, the cluster size may range up to several tens of thousands of atoms, and the beam dose may range up to about $1 \times 10^{17}$ clusters per $cm^2$. For example, the beam acceleration potential may range from about 1 kV to about 70 kV (i.e., the beam energy may range from about 1 keV to about 70 keV). Additionally, for example, the beam dose may range from about $1 \times 10^{15}$ clusters per $cm^2$ to about $1 \times 10^{17}$ clusters per $cm^2$.

The beam acceleration potential may be used to modify the depth of penetration of the one or more elements in the target region, i.e., increasing the beam acceleration potential increases the depth and decreasing the beam acceleration potential decreases the depth. Additionally, the beam dose may be used to modify the concentration of the one or more elements in the target region, i.e., increasing the beam dose increases the final concentration and decreasing the beam dose decrease the final concentration. The GCIB is accelerated according to the beam acceleration potential, and the target region is exposed to the GCIB according to the beam dose.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the target region per unit area (i.e., number of clusters per unit area per unit time) may be held constant while the time is varied to change the beam dose.

Furthermore, the energy per atom ratio may be used to adjust the concentration of one or more elements present or not present in the target region and/or the depth to which the one or more elements are present in the target region. For instance, while decreasing the energy per atom ratio, the adjusted depth may be decreased. Alternatively, while increasing the energy per atom ratio, the adjusted depth may be increased.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Additionally yet, other GCIB properties may be varied to adjust the amorphizing, doping or modification of the target region including, but not limited to, beam energy distribution, cluster size distribution, or gas nozzle design (such as nozzle throat diameter, nozzle length, and/or nozzle divergent section half-angle).

Furthermore, as described above, one or more thermal anneals may be performed to modify and/or enhance a material property of a target region during preparation of the light-emitting device. For any one of these thermal anneals, the substrate may be subjected to a thermal treatment, wherein the temperature of the target region is elevated to a material-specific temperature for a period of time. The temperature and the time for the annealing process may be adjusted in order to vary the properties of the target region. For example, the temperature of the target region may be elevated to a value greater than about 800 degrees C. Additionally, for example, the temperature of the target region may be elevated to a value greater than about 850 degrees C. Additionally yet, for example, the temperature of the target region may be elevated to a value greater than about 900 degrees C. Furthermore, for example, the time for the annealing process may be greater than about 1 millisecond. The annealing process may be performed at atmospheric pressure or reduced pressure. Additionally, the annealing process may be performed with or without an inert gas atmosphere. Furthermore, the annealing process may be performed in a furnace, a rapid thermal annealing (RTP) system, a flash lamp annealing system, or a laser annealing system.

Figure 9:
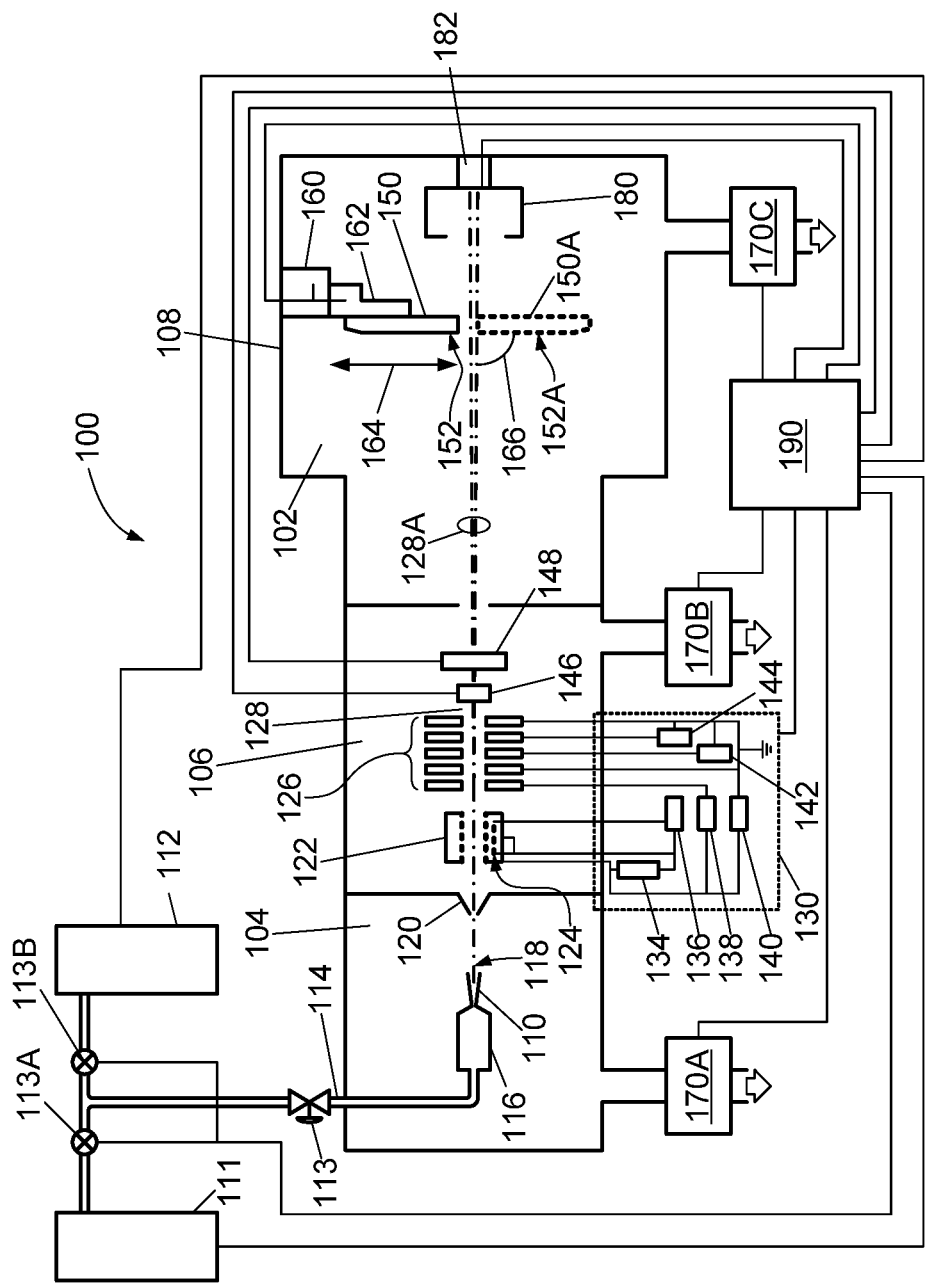
FIG. 9 is an illustration of a GCIB processing system.

Referring now to FIG. 9, a GCIB processing system 100 for treating a substrate as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 9, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 9, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to be introduced to the target region.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 9, beam electronics 130 are utilized to ionize, extract, accelerate, and focus the GCIB 128. The beam electronics 130 include a filament power supply 136 that provides voltage VF to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 9, the beam electronics 130 further include an anode power supply 134 that provides voltage VA to an anode of ionizer 122 for accelerating electrons emitted from filament 124 and causing the electrons to bombard the gas clusters in gas cluster beam 118, which produces cluster ions.

Additionally, as illustrated in FIG. 9, the beam electronics 130 include an extraction power supply 138 that provides voltage VEE to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage VACC to bias one of the high voltage electrodes 126 with respect to the ionizer 122 so as to result in a total GCIB acceleration energy equal to about VACC electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., VL1 and VL2) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at VACC. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 9, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 9, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 9, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 10:
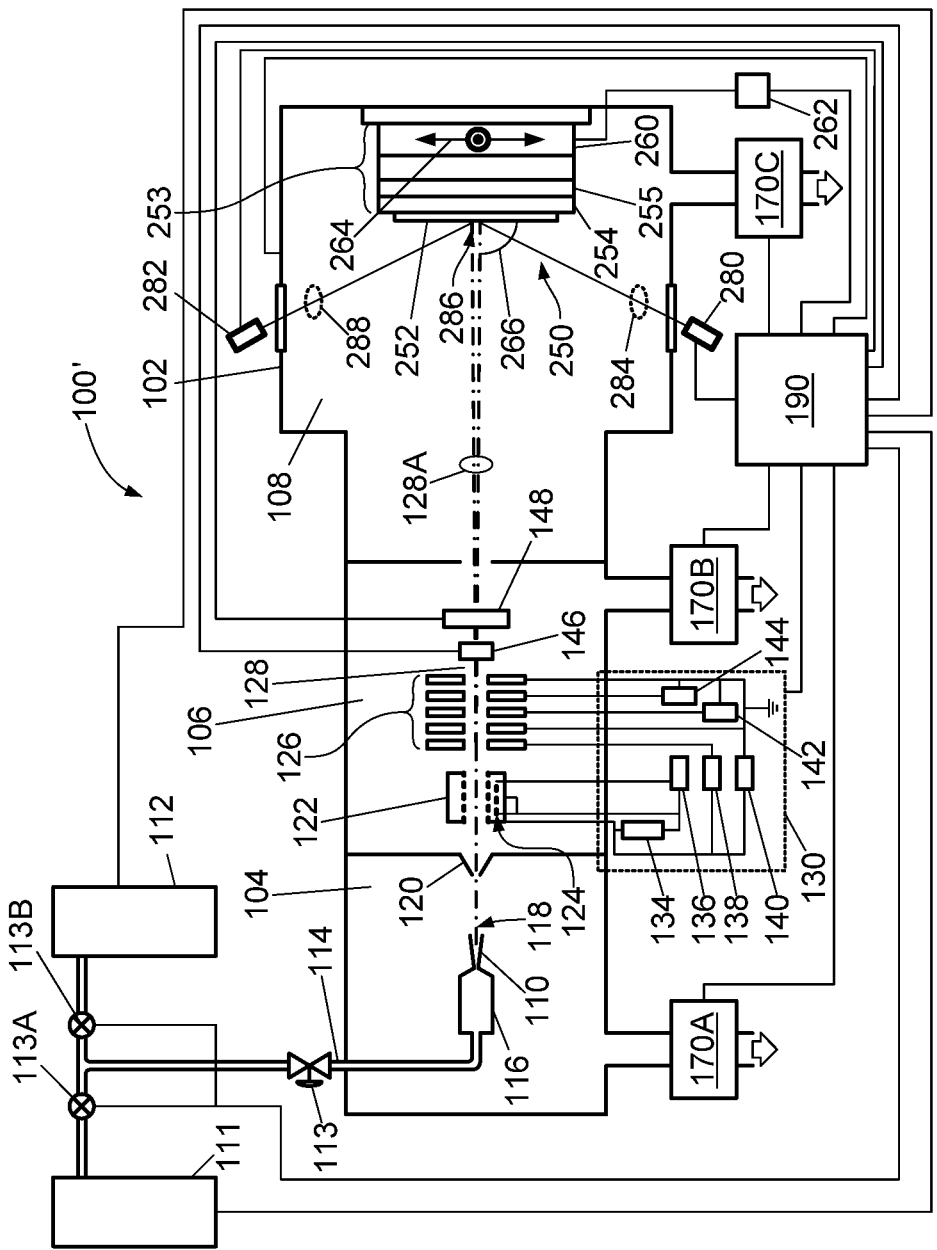
FIG. 10 is another illustration of a GCIB processing system.

In the embodiment shown in FIG. 10, the GCIB processing system 100' can be similar to the embodiment of FIG. 9 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 9) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage VF or varying an anode voltage VA; modulating the lens focus by varying lens voltages VL1 and/or VL2; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 11:
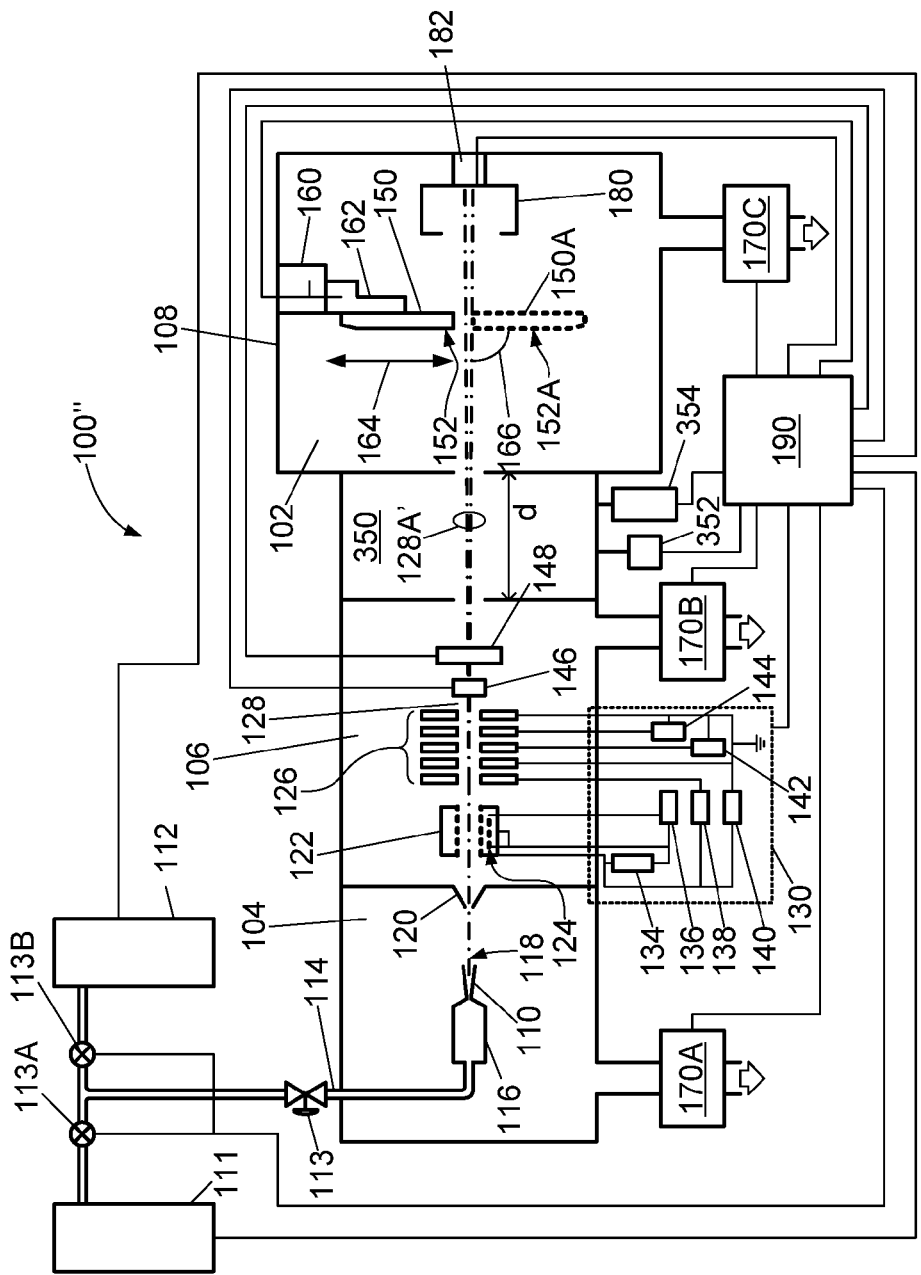
FIG. 11 is yet another illustration of a GCIB processing system.

In the embodiment shown in FIG. 11, the GCIB processing system 100" can be similar to the embodiment of FIG. 9 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100''), or it can be remotely located relative to the GCIB processing system 100 (or 100', 100''). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 12:
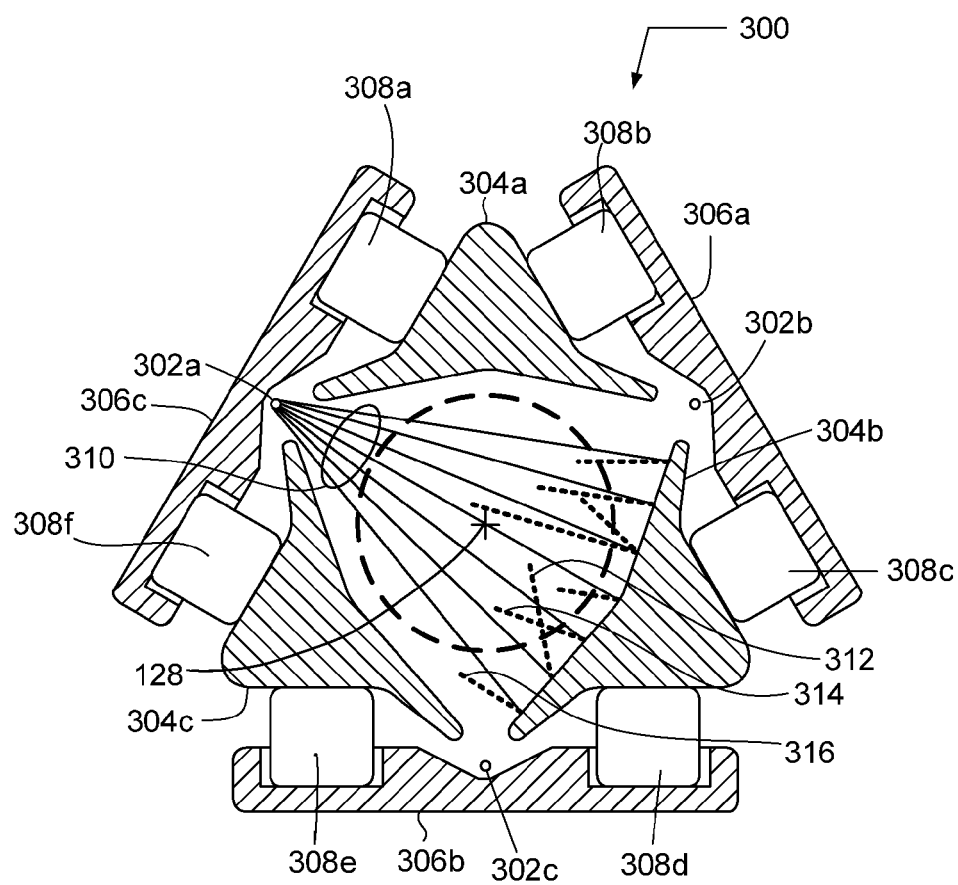
FIG. 12 is an illustration of an ionization source for a GCIB processing system.

Referring now to FIG. 12, a section 300 of a gas cluster ionizer (122, FIGS. 9, 10 and 11) for ionizing a gas cluster jet (gas cluster beam 118, FIGS. 9, 10 and 11) is shown. The section 300 is normal to the axis of GCIB 128. For typical gas cluster sizes (2000 to 15000 atoms), clusters leaving the skimmer aperture (120, FIGS. 9, 10 and 11) and entering an ionizer (122, FIGS. 9, 10 and 11) will travel with a kinetic energy of about 130 to 1000 electron volts (eV). At these low energies, any departure from space charge neutrality within the ionizer 122 will result in a rapid dispersion of the jet with a significant loss of beam current. FIG. 12 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Figure 13:
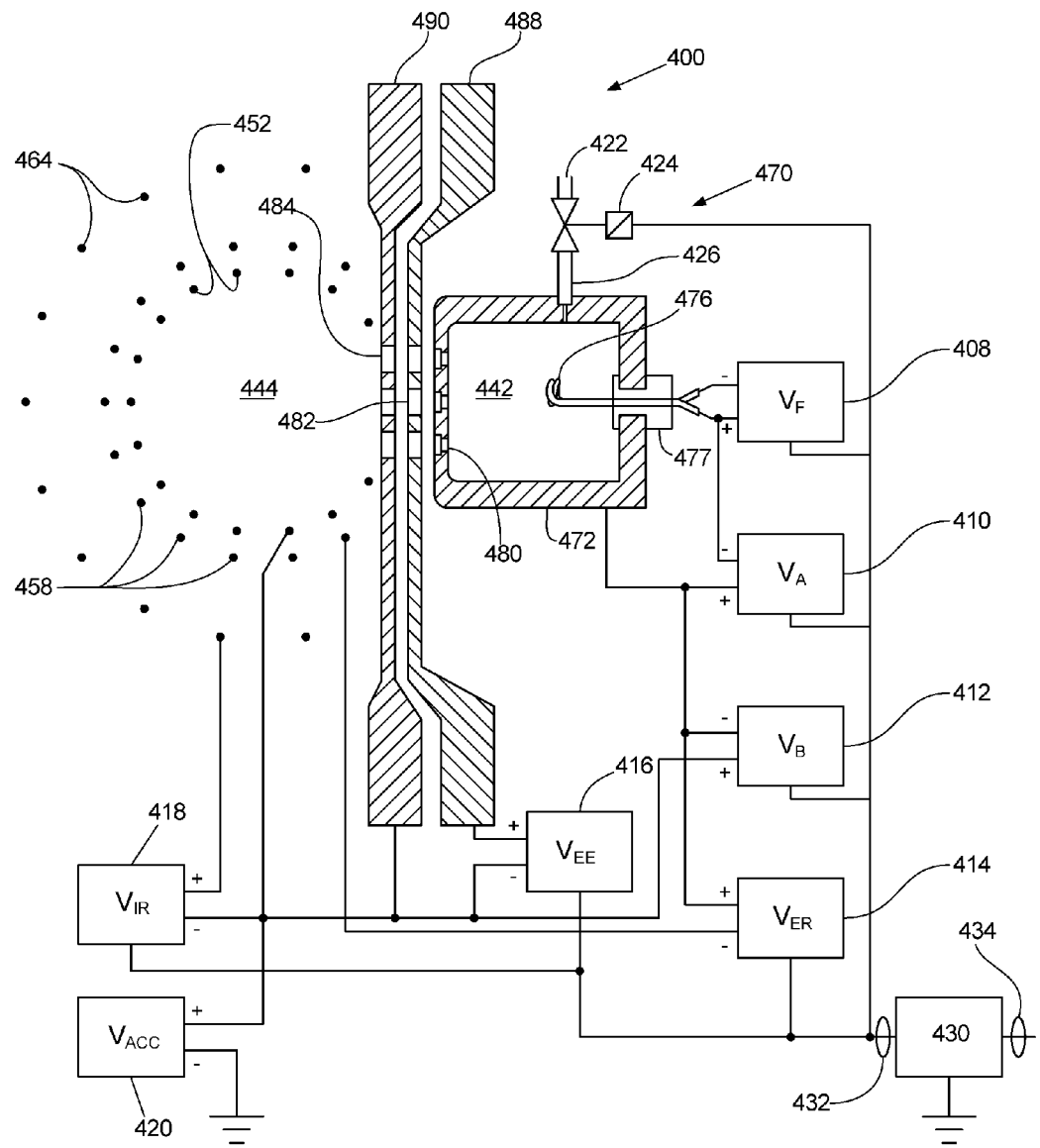
FIG. 13 is an illustration of another ionization source for a GCIB processing system.

Alternatively, ionizers may use electron extraction from plasma to ionize clusters. The geometry of these ionizers is quite different from the three filament ionizer described above but the principles of operation and the ionizer control are very similar. Referring now to FIG. 13, a section 400 of a gas cluster ionizer (122, FIGS. 9, 10 and 11) for ionizing a gas cluster jet (gas cluster beam 118, FIGS. 9, 10 and 11) is shown. The section 400 is normal to the axis of GCIB 128. For typical gas cluster sizes (2000 to 15000 atoms), clusters leaving the skimmer aperture (120, FIGS. 9, 10 and 11) and entering an ionizer (122, FIGS. 9, 10 and 11) will travel with a kinetic energy of about 130 to 1000 electron volts (eV). At these low energies, any departure from space charge neutrality within the ionizer 122 will result in a rapid dispersion of the jet with a significant loss of beam current. FIG. 13 illustrates a self-neutralizing ionizer. As with other ionizers, gas clusters are ionized by electron impact.

The ionizer includes an array of thin rod anode electrodes 452 that is supported and electrically connected by a support plate (not shown). The array of thin rod anode electrodes 452 is substantially concentric with the axis of the gas cluster beam (e.g., gas cluster beam 118, FIGS. 9, 10 and 11). The ionizer also includes an array of thin rod electron-repeller rods 458 that is supported and electrically connected by another support plate (not shown). The array of thin rod electron-repeller electrodes 458 is substantially concentric with the axis of the gas cluster beam (e.g., gas cluster beam 118, FIGS. 9, 10 and 11). The ionizer further includes an array of thin rod ion-repeller rods 464 that is supported and electrically connected by yet another support plate (not shown). The array of thin rod ion-repeller electrodes 464 is substantially concentric with the axis of the gas cluster beam (e.g., gas cluster beam 118, FIGS. 9, 10 and 11).

Energetic electrons are supplied to a beam region 444 from a plasma electron source 470. The plasma electron source 470 comprises a plasma chamber 472 within which plasma is formed in plasma region 442. The plasma electron source 470 further comprises a thermionic filament 476, a gas entry aperture 426, and a plurality of extraction apertures 480. The thermionic filament 476 is insulated from the plasma chamber 470 via insulator 477. As an example, the thermionic filament 476 may include a tungsten filament having one-and-a-half turns in a "pigtail" configuration.

The section 400 of the gas cluster ionizer comprises an electron-acceleration electrode 488 having plural apertures 482. Additionally, the section 400 comprises an electron-deceleration electrode 490 having plural apertures 484. The plural apertures 482, the plural apertures 484, and the plural extraction apertures 480 are all aligned from the plasma region 442 to the beam region 444.

Plasma forming gas, such as a noble gas, is admitted to the plasma chamber 472 through gas entry aperture 426. An insulate gas feed line 422 provides pressurized plasma forming gas to a remotely controllable gas valve 424 that regulates the admission of plasma forming gas to the plasma chamber 472.

A filament power supply 408 provides filament voltage (VF) for driving current through thermionic filament 476 to stimulate thermo-electron emission. Filament power supply 408 controllably provides about 140 to 200 A (amps) at 3 to 5 V (volts). An arc power supply 410 controllably provides an arc voltage (VA) to bias the plasma chamber 472 positive with respect to the thermionic filament 476. Arc power supply 410 is typically operated at a fixed voltage, typically about 35 V, and provides means for accelerating the electrons within the plasma chamber 472 for forming plasma. The filament current is controlled to regulate the arc current supplied by the arc power supply 410. Arc power supply 410 is capable of providing up to 5 A arc current to the plasma arc.

Electron deceleration electrode 490 is biased positively with respect to the plasma chamber 472 by electron bias power supply 412. Electron bias power supply 412 provides bias voltage (VB) that is controllably adjustable over the range of from 30 to 400 V. Electron acceleration electrode 488 is biased positively with respect to electron deceleration electrode 490 by electron extraction power supply 416. Electron extraction power supply 416 provides electron extraction voltage (VEE) that is controllable in the range from 20 to 250 V. An acceleration power supply 420 supplies acceleration voltage (VACC) to bias the array of thin rod anode electrodes 452 and electron deceleration electrode 490 positive with respect to earth ground. VACC is the acceleration potential for gas cluster ions produced by the gas cluster ionizer shown in section 400 and is controllable and adjustable in the range from 1 to 100 kV. An electron repeller power supply 414 provides electron repeller bias voltage (VER) for biasing the array of thin rod electron-repeller electrodes 458 negative with respect to VACC. VER is controllable in the range of from 50 to 100 V. An ion repeller power supply 418 provides ion repeller bias voltage (VIR) to bias the array of thin rod ion-repeller electrodes 464 positive with respect to VACC. VIR is controllable in the range of from 50 to 150 V.

A fiber optics controller 430 receives electrical control signals on cable 434 and converts them to optical signals on control link 432 to control components operating at high potentials using signals from a grounded control system. The fiber optics control link 432 conveys control signals to remotely controllable gas valve 424, filament power supply 408, arc power supply 410, electron bias power supply 412, electron repeller power supply 414, electron extraction power supply 416, and ion repeller power supply 418.

For example, the ionizer design may be similar to the ionizer described in U.S. Pat. No. 7,173,252, entitled "Ionizer and method for gas-cluster ion-beam formation"; the content of which is incorporated herein by reference in its entirety.

The gas cluster ionizer (122, FIGS. 9, 10 and 11) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for preparing a semiconductor-based light-emitting device, comprising:
   forming a light-emitting device stack on a substrate, said stack comprising a plurality of device layers; and
   irradiating at least a portion of an interface region between device layers within said light-emitting device stack, between said light-emitting device stack and a metal contact layer formed thereon, or between said light-emitting device stack and said substrate with a gas cluster ion beam (GCIB) to amorphize said interface region, etch said interface region, clean said interface region, dope said interface region, infuse said interface region, modify said interface region, deposit material on said interface region, or grow material on said interface region, or any combination of two or more thereof.

2. The method of claim 1, further comprising:
   preparing said interface region between said light-emitting device stack and said substrate by forming an intermediate layer on said substrate, said intermediate layer disposed between said substrate and said light-emitting device stack, and
   wherein said irradiating includes irradiating at least a portion of said substrate in said interface region with said GCIB to create a graded mixed layer at said interface region between said intermediate layer and said substrate.

3. The method of claim 2, wherein said substrate comprises silicon, un-doped silicon, doped silicon, single crystal silicon, poly-crystalline silicon, doped single crystal silicon, un-doped single crystal silicon, silicon-germanium (SiGe), silicon carbide (SiC), a compound semiconductor, zinc oxide, or sapphire, or any combination of two or more thereof.

4. The method of claim 2, wherein said intermediate layer comprises an identical layer in composition to a first deposited device layer of said light-emitting device stack, a buffer layer between said light-emitting device stack and said substrate, an adhesion-promoting layer between said light-emitting device stack and said substrate, or a transition layer having an intermediate value for a coefficient of thermal expansion, or any combination of two or more thereof.

5. The method of claim 2, wherein said intermediate layer comprises a nitride-containing layer, a Group III-nitride layer, a GaN layer, an AlN layer, or an AlGaN layer, or any combination of two or more thereof.

6. The method of claim 2, wherein said irradiating follows said forming said intermediate layer on said substrate or precedes said forming said intermediate layer on said substrate.

7. The method of claim 2, further comprising:
annealing said substrate before, during, or after said forming said intermediate layer on said substrate.

8. The method of claim 2, wherein said GCIB comprises at least one element selected from the group consisting of He, Ne, Ar, Xe, Kr, B, C, Si, Ge, N, P, As, O, S, F, Cl, and Br.

9. The method of claim 2, wherein said GCIB comprises at least one film forming constituent for depositing or growing a thin film on said substrate or said intermediate layer.

10. The method of claim 2, wherein said irradiating comprises:
establishing said GCIB;
selecting a beam energy, a beam energy distribution, a beam focus, and a beam dose;
accelerating said GOB to achieve said beam energy;
focusing said GCIB to achieve said beam focus; and
exposing said portion of said substrate in said interface region to said accelerated GCIB according to said beam dose.

11. The method of claim 10, wherein said beam energy ranges from about 1 keV to about 100 keV, and said beam dose ranges from about $1 \times 10^{12}$ clusters per $cm^2$ to about $1 \times 10^{15}$ clusters per $cm^2$.

12. The method of claim 10, further comprising:
selecting said beam energy and said beam dose to achieve a desired thickness of a mixed layer formed during said irradiating.

13. The method of claim 2, wherein said intermediate layer is a Group III-nitride layer, and said irradiating follows said forming said intermediate layer, the method thereafter further comprising:
annealing said substrate and said intermediate layer; and
forming another Group III-nitride layer on said intermediate layer as a first deposited device layer of said light-emitting device stack.

14. The method of claim 13, wherein said substrate comprises single crystal silicon, and said Group III-nitride layer comprises GaN.

15. The method of claim 2, further comprising:
performing corrective processing of the semiconductor-based light-emitting device, comprising:
acquiring metrology data for said substrate and/or said light-emitting device stack;
computing correction data for location specific processing of said substrate and/or said light-emitting device stack; and
applying said correction data to said substrate and/or said light-emitting device stack using said GCIB.

16. The method of claim 15, wherein said applying said correction data facilitates correction of substrate defects, correction of light-emitting device stack defects, correction of substrate surface planarity, correction of device layer thickness, or improvement of device layer adhesion.

17. The method of claim 15, wherein said metrology data for said substrate and/or said light-emitting device stack comprises a film thickness, a surface roughness, a surface contamination, a feature depth, a trench depth, a via depth, a feature width, a trench width, a via width, a critical dimension (CD), or an electrical resistance, or any combination of two or more thereof.

18. The method of claim 1, wherein said light-emitting device stack includes a semiconductor layer, the method further comprising:
forming a metal contact layer on said semiconductor layer for an end-type contact in the semiconductor-based light-emitting device, wherein said irradiating is of said interface region between said semiconductor layer and said metal contact layer to modify a property of said metal contact layer, or said semiconductor layer, or both said metal contact layer and said semiconductor layer, and increase carrier tunneling between said metal contact layer and said semiconductor layer.

19. The method of claim 18, wherein said metal contact layer comprises Au, Al, Ni, Pt, Pd, In, or an alloy thereof.

20. The method of claim 18, wherein said semiconductor layer comprises a Group III-V compound, a GaN layer, a p-type GaN layer, or an n-type GaN layer.

21. The method of claim 18, wherein said GCIB comprises at least one element selected from the group consisting of He, Ne, Ar, Xe, Kr, B, C, Si, Ge, N, P, As, O, S, F, Cl, and Br.

22. The method of claim 18, wherein said irradiating follows said forming said metal contact layer on said semiconductor layer or precedes said forming said metal contact layer on said semiconductor layer.

23. The method of claim 18, further comprising:
forming one or more intermediate layers in the interface region between said metal contact layer and said semiconductor layer.

24. The method of claim 23, wherein at least one of said one or more intermediate layers comprises a Group II-VI compound, or a dopant.

25. The method of claim 24, wherein said dopant comprises Mg, Be, or As, or a combination thereof.

26. The method of claim 25, wherein said irradiating drives at least a portion of said dopant from said one or more intermediate layers into said semiconductor layer, and wherein said irradiating precedes said forming said metal contact layer on said semiconductor layer, and follows said forming said one or more intermediate layers on said semiconductor layer.

27. The method of claim 18, wherein said GCIB comprises at least one film forming constituent for depositing or growing a thin film on said semiconductor layer or said metal contact layer.

28. The method of claim 18, further comprising:
irradiating a region of said substrate with another GCIB to amorphize said region, etch said region, clean said region, dope said region, modify said region, deposit material on said region, or grow material on said region, or any combination of two or more thereof.

29. The method of claim 18, wherein said irradiating comprises:
establishing said GCIB;
selecting a beam energy, a beam energy distribution, a beam focus, and a beam dose;
accelerating said GCIB to achieve said beam energy;
focusing said GCIB to achieve said beam focus; and
exposing said interface region to said accelerated GCIB according to said beam dose.

30. The method of claim 29, wherein said beam energy ranges from about 1 keV to about 100 keV, and said beam dose ranges from about $1 \times 10^{12}$ clusters per $cm^2$ to about $1 \times 10^{15}$ clusters per $cm^2$.

31. The method of claim 30, further comprising:
selecting said beam energy and said beam dose to achieve a desired work function for said metal contact layer, a desired work function for said semiconductor layer, a desired dopant concentration in said metal contact layer, a desired dopant concentration in said semiconductor layer, or any combination of two or more thereof.

* * * * *

UNITED STATES PATENT AND TRADEMARK OFFICE
CERTIFICATE OF CORRECTION

PATENT NO. : 8,481,340 B2
APPLICATION NO. : 13/074618
DATED : July 9, 2013
INVENTOR(S) : John J. Hautala It is certified that error appears in the above-identified patent and that said Letters Patent is hereby corrected as shown below:

Title Page 2, Col. 2, line 6, "Shaq et al." should read --Shao et al.--.

Signed and Sealed this
Fifteenth Day of October, 2013

Teresa Stanek Rea
*Deputy Director of the United States Patent and Trademark Office*